US012731958B2

(12) United States Patent
Orchard et al.

(10) Patent No.: US 12,731,958 B2
(45) Date of Patent: Sep. 8, 2026

(54) ELECTRICAL CONTACT

(71) Applicant: VECTOR PHOTONICS LIMITED, Glasgow (GB)

(72) Inventors: Jonathan Robert Orchard, Glasgow (GB); David Childs, Bearsden (GB); Richard Taylor, Glasgow (GB)

(73) Assignee: Vector Photonics Limited, Glasgow (GB)

( * ) Notice: Subject to any disclaimer, the term of this patent is extended or adjusted under 35 U.S.C. 154(b) by 751 days.

(21) Appl. No.: 18/111,737

(22) Filed: Feb. 20, 2023

(65) Prior Publication Data

US 2024/0079853 A1 Mar. 7, 2024

(51) Int. Cl.
*H01S 5/042* (2006.01)
*H01S 5/11* (2021.01)
(Continued)

(52) U.S. Cl.
CPC ............ *H01S 5/04254* (2019.08); *H01S 5/11* (2021.01); *H01S 5/185* (2021.01); *H01S 5/183* (2013.01)

(58) Field of Classification Search
CPC ............... H01S 5/183–187; H01S 5/11; H01S 5/04254; H01S 5/0425–04257; H01L 23/4824
See application file for complete search history.

(56) References Cited

U.S. PATENT DOCUMENTS 6,356,573 B1 * 3/2002 Jonsson .............. H01S 5/18355 372/19
2002/0167983 A1 * 11/2002 Marutani .............. H01S 5/1082 372/46.01
(Continued)

FOREIGN PATENT DOCUMENTS

CN 109326958 A 2/2019
EP 0650202 A1 4/1995
(Continued)

OTHER PUBLICATIONS

International Search Report dated Jan. 2, 2024 for PCT/GB2023/052242.
(Continued)

*Primary Examiner* — Sean P Hagan
(74) *Attorney, Agent, or Firm* — Fisher Broyles, LLP

(57) ABSTRACT

An electrical contact for a semiconductor device, and a method of forming an electrical contact is disclosed. The electrical contact includes a perimeter area, an aperture located within the perimeter area and one or more electrical tracks extending from the perimeter area into the aperture. The one or more electrical tracks have a non-linear shape. The presence of the one or more electrical tracks within the aperture provides a way to remove, or significantly reduce, the problematic effects of current crowding within a semiconductor device in which it is employed. The electrical contacts provide particular application for semiconductor laser devices. When the electrical contact is located on an output surface of the semiconductor laser device, the condition for a diffraction pattern to be imparted onto the emission profile of the output light of the semiconductor laser device is removed, thus improving the overall beam quality of the output light.

20 Claims, 5 Drawing Sheets

(51) Int. Cl.

| | |
|---|---|
| ***H01S 5/183*** | (2006.01) |
| ***H01S 5/185*** | (2021.01) |

(56) References Cited

U.S. PATENT DOCUMENTS

| | | | | |
|---|---|---|---|---|
| 2004/0012958 | A1* | 1/2004 | Hashimoto .......... | H10H 20/831 257/E33.068 |
| 2006/0192223 | A1* | 8/2006 | Lee ...................... | H10H 20/831 257/99 |
| 2010/0025705 | A1* | 2/2010 | Wang ................... | H10H 20/831 257/E33.056 |
| 2020/0106240 | A1 | 4/2020 | Takiguchi et al. | |
| 2021/0384703 | A1* | 12/2021 | Watkins ............... | H05B 47/105 |
| 2023/0070461 | A1 | 3/2023 | Hashimoto et al. | |

FOREIGN PATENT DOCUMENTS

| | | | |
|---|---|---|---|
| EP | 1028505 | A1 | 8/2000 |
| EP | 3062354 | A1 | 8/2016 |

OTHER PUBLICATIONS

Feng Yuan et al: "Temperature characteristic of 808nm VCSELs with large aperture", Proceedings of SPIE, IEEE, US, vo1. 9521, Mar. 4, 2015 (Mar. 4, 2015), pp. 95210L-95210L, XP060045787, DOI: 10.1117/12.2087562 ISBN: 978-1-62841-730-2 p. 95210LI, paragraph 1—p. 95210L6, paragraph 1; figures 1-7.

Li Yufei et al: "Study on the new structure of vertical cavity surface emitting laser and its beam characteristics", 2015 Inteiuiational Conference on Optoelectronics and Microelectronics (ICON), IEEE, Jul. 16, 2015 (Jul. 16, 2015), pp. 87-89, XP032858533, DOI: 10.1109/ICOOM.2015.7398777 [retrieved on Feb. 3, 2016] p. 87, left-hand column, paragraph 3—p. 89, left-hand column, paragraph 2; figures.

Chua, C.L., "Indium Tin Oxide Transparent Electrodes for Broad-Area Top-Emitting Vertical-Cavity Lasers Fabricated Using a Single Lithography Step," IEEE Photonics Technology Letters, vol. 9, No. 5, May 1997 551-553.

Hao, Yong-Qin, "Large aperture vertical cavity surface emitting laser with distributed-ring contact," Applied Optics / vol. 50, No. 7 / Mar. 1, 2011, 1034-1037.

* cited by examiner

ELECTRICAL CONTACT

The present invention relates to the field of semiconductor devices and in particular to an electrical contact for a semiconductor device. The electrical contact has application to semiconductor laser devices and, in particular, laser devices based on a photonic crystal surface emitting laser (PCSEL).

Semiconductor laser devices are solid-state lasers based on semiconductor gain media, where optical amplification is usually achieved by stimulated emission at an inter band transition under conditions of a high carrier density in the conduction band. Most semiconductor laser devices are laser diodes based on a semiconductor gain media, which is pumped with an electrical current in a region where n-doped and p-doped semiconductor materials meet. As the photon energy of a laser diode is close to the bandgap energy, compositions with different bandgap energies allow for different emission wavelengths.

There is a great variety of semiconductor laser devices, spanning wide parameter regions and many different application areas. Fabry Perot (FP) lasers are the original, semiconductor laser device technology. In these devices the laser feedback and emission are both in-plane and the gain reflection is produced by facet mirrors such that the generated output light comes out of an end of the laser. For this reason, FP lasers are often referred to as edge emitting lasers (EEL).

An alternative type of EEL laser is a Distributed Feedback Laser (DFB). DFB lasers also have in-plane feedback and emission, but in these devices the gain reflection is produced by the employment of a grating structure.

Another type of known semiconductor laser device technology is Vertical Cavity Surface Emitting Lasers (VCSELs). These devices were first produced in the early 1990's. Within these devices, laser feedback and emission are both out of plane, where the laser output light emits from a top surface of the laser.

Photonic crystal surface emitting lasers (PCSELs) are a newer class of semiconductor laser device. PCSELs have been found to have beneficial properties including coherent oscillation, and low divergences of emitted light. PCSELs are also the only semiconductor laser design that employs in-plane feedback and out of plane, surface emission.

PCSELs can be made from a number of different semiconductor materials. An example PCSEL structure, as generally depicted by reference numeral 1, is presented in FIGS. 1(*a*) and 1(*b*). In particular, FIG. 1(*a*) presents an exploded perspective view of the PCSEL 1, while FIG. 1(*b*) presents a cross sectional view of the PCSEL 1.

The PCSEL 1 of FIGS. 1(*a*) and 1(*b*) can be seen to comprises an n-AlGaAs lower cladding layer 2, an InGaAs active layer 3, an InGaP photonic crystal layer 4, a p-AlGaAs upper cladding layer 5, a first electrical contact 6 located on the output surface 7 of the PCSEL 1 and a second electrical contact 8 provided adjacent to the lower cladding layer 2. In FIG. 1(*a*) a section of the p-AlGaAs upper cladding layer 5 has been cut away solely for the purpose of assisting understanding.

As shown in FIGS. 1(*a*) and 1(*b*), the first electrical contact 6 is square shaped, with an aperture 9, through which output light 10 of the PCSEL 1 is extracted when the PCSEL 1 is lasing. It is also known in the art for the first electrical contact 6 to be circular in shape with a central aperture again being formed therein.

The active layer 3 may contain quantum wells and or quantum dots. For example, it may contain one or more of InGaAs/GaAs quantum wells, InAs/GaAs quantum dots, GaAs/AlGaAs quantum wells, InGaAsP quantum wells and AlInGaAsP quantum wells, although many other active layer 3 designs are known to those in the art.

The photonic crystal layer 4 is typically formed by patterning the InGaP layer with periodic regions 11 having a second refractive index which is different from the first refractive index of the InGaP, thus forming the periodic lattice structure within the photonic crystal layer 4. The periodic regions 11 having the second refractive index different from the InGaP material may be left as air gaps or voids. Alternatively, the periodic regions 11 may be filled by overgrowth with a suitable filler material having a second refractive index, such as GaAs. The lattice structure of the photonic crystal layer 4 causes Bragg diffraction within the photonic crystal layer 4, which in turn causes light to resonate in the photonic crystal layer 4 at a particular wavelength determined by the periodicity, or lattice constant, of the photonic crystal layer 4. As an alternative to InGaP, the photonic crystal layer 4 may be formed from an InGaAsP layer.

When a voltage is applied across a PCSEL 1 via the first 6 and second 8 electrical contacts, the active layer 3 emits light. Light leaks out of the active layer 3 and into the photonic crystal layer 4. Light in the photonic crystal layer 4 having a wavelength coincident with the lattice constant of the photonic crystal layer 4 resonates in the photonic crystal and is amplified. This amplified light 10 then leaves the PCSEL 1 through the output surface 7.

A known problem associated with applying a voltage across a semiconductor material is current crowding also known as the current crowding effect (CCE). This effect refers to the non-homogenous distribution of current density through the semiconductor material (e.g. a PCSEL 1) and is most prevalent in the vicinity of the electrical contacts and over PN junctions. Materials with low mobility of charge carriers, e.g. aluminium gallium indium phosphide (AlGaInP), are especially prone to this current crowding phenomena. Current crowding can lead to localised overheating and formation of thermal hotspots within the semiconductor material, in catastrophic cases leading to thermal runaway. Current crowding occurs especially in areas of localised lowered resistance, or in areas where the field strength is concentrated (e.g. at the edges of semiconductor layers).

In conventional top-emitting VCSELs, and PCSELs 1 of the type described above, which comprise a single ring type contact on the output surface 7, the current injected into the centre of the active layer 3 is practically insignificant, but increases with increasing radial distance from a device axis, generally depicted by reference numeral 12. Therefore, the power of the output light 10 is found to increase with the radial distance from the device axis 12 which is a limiting factor on the size of the devices which can be manufactured. In addition, the larger the aperture 9, the poorer the quality of the emission profile of the output light 10.

There are a number of methods known in the art for addressing the problematic effect of current crowding within a semiconductor device.

One method involves employing an indium tin oxide (ITO) transparent electrical contact to enable current injection over the apertured area, see for example a paper by Chua et al, entitled "*Indium tin oxide transparent electrodes for broad-area top-emitting vertical-cavity lasers fabricated using a single lithography step*" IEEE Photonics Technology Letters (Volume: 9, Issue 5, pages 551 to 553, May 1997). A problem with employing ITO electrical contacts is that their contact resistance is higher than that of a conventional metal n-type contacts and there is also a certain amount of optical loss introduced by the presence of such a layer.

Another method is to place a thin electrically conductive cross across the aperture 9 to allow current injection in the apertured region, see for example a paper by Hao et al, entitled "*Large aperture vertical cavity surface emitting laser with distributed-ring contact*" Applied Optics (Volume 50, Issue 7, pages 1034 to 1037, 2011). A problem that the applicants have found with employing electrically conductive crosses across the aperture 9 is that they impart a diffraction pattern onto the emission profile of the output light 10. This is particularly evident in the far field emission profile of the output light 10 and so is a limiting factor in the employment of such electrical contacts within semiconductor lasers intended to be employed within long range application e.g. laser power beaming, free space communication systems, 3-D printing and laser cutting.

SUMMARY OF INVENTION

It is therefore an object of an embodiment of the present invention to obviate or at least mitigate the foregoing problematic effects of current crowding within a semiconductor device known in the art.

It is a further object of an embodiment of the present invention to provide an alternative electrical contact whose employment with a semiconductor device obviates or at least mitigates the foregoing problematic effects of current crowding within the device.

A yet further object of an embodiment of the present invention is to provide an alternative electrical contact whose employment with a semiconductor laser obviates or at least mitigates the problematic effect of diffraction patterns being imparted onto the emission profile of the output light generated by the semiconductor laser.

According to a first aspect of the present invention there is provided an electrical contact for a semiconductor device, the electrical contact comprising a perimeter area, an aperture located within the perimeter area and one or more electrical tracks extending from the perimeter area into the aperture, wherein the one or more electrical tracks comprise a non-linear shape.

The presence of the one or more electrical tracks within the aperture provide an alternative means to remove, or significantly reduce, the problematic effects of current crowding within semiconductor devices in which they are employed.

Preferably, the one or more electrical tracks extend from the perimeter area to a free end within the aperture.

Preferably the one or more electrical tracks are non-overlapping within the aperture.

The one or more electrical tracks may form the arms of a spiral pattern. Preferably a centre of the spiral pattern coincides with the centre of the aperture. Alternatively, the one or more electrical tracks may be s-shaped or curved shaped tracks.

Preferably the perimeter area comprises a regular or irregular shape e.g. a square, a diamond, a rectangle or a circle. Similarly, it is preferable for the aperture to comprise a regular or irregular shape e.g. a square, a diamond, a rectangle or a circle.

Preferably, the electrical contact is formed from an electrically conductive metal. Most preferably, the electrical contact is formed from gold (Au).

According to a second aspect of the present invention there is a provided a semiconductor laser device comprising an electrical contact in accordance with the first aspect of the present invention.

Most preferably the electrical contact is located on an output surface of the semiconductor laser device. Optionally, the electrical contact is located on a cladding layer of the semiconductor laser device. Alternatively, the electrical contact is located on a photonic crystal layer of the semiconductor laser device. Further alternatively, the electrical contact is located on an active layer of the semiconductor laser device.

Since the one or more electrical tracks extending from the perimeter area into the aperture comprise a non-linear shape the condition for a diffraction pattern to be imparted onto the emission profile of the semiconductor laser device is removed. This makes the semiconductor laser devices particularly suitable for employment within long range application e.g. laser power beaming, free space communication systems, 3-D printing and laser cutting.

Most preferably the semiconductor laser device comprises a photonic crystal surface emitting laser (PCSEL). Alternatively, the semiconductor laser device comprises a vertical cavity surface emitting laser (VCSEL).

Embodiments of the second aspect of the present invention may comprise features to implement the preferred or optional features of the first aspect of the present invention or vice versa.

According to a third aspect of the present invention there is provided a method of forming an electrical contact for a semiconductor device, the method comprising:

- defining a perimeter area of the electrical contact;
- providing an aperture located within the perimeter area; and
- providing one or more electrical tracks extending from the perimeter area into the aperture wherein the one or more electrical tracks comprise a non-linear shape.

Embodiments of the third aspect of the present invention may comprise features to implement the preferred or optional features of the first or second aspects of the present invention or vice versa.

According to a fourth aspect of the present invention there is a provided a method of forming a semiconductor laser device the method comprising providing an electrical contact in accordance with the method of the third aspect of the present invention.

Most preferably the electrical contact is provided on an output surface of the semiconductor laser device. Optionally, the electrical contact provided on a cladding layer of the semiconductor laser device. Alternatively, the electrical contact is provided on a photonic crystal layer of the semiconductor laser device. Further alternatively, the electrical contact is provided on an active layer of the semiconductor laser device.

Most preferably the semiconductor laser device comprises a photonic crystal surface emitting laser (PCSEL).

Embodiments of the fourth aspect of the present invention may comprise features to implement the preferred or optional features of the first, second or third aspects of the present invention or vice versa.

According to a fifth aspect of the present invention there is provided an electrical contact for a semiconductor device, the electrical contact comprising a perimeter area, an aperture located within the perimeter area and one or more electrical tracks each consisting of a non-linear shape which extends from the perimeter area into the aperture.

Embodiments of the fifth aspect of the present invention may comprise features to implement the preferred or optional features of the first to fourth aspects of the present invention or vice versa.

BRIEF DESCRIPTION OF DRAWINGS

There will now be described, by way of example only, various embodiments of the invention with reference to the drawings, of which:

FIG. 1(*b*) presents a cross sectional view of a photonic crystal surface emitting laser (PCSEL) as known in the art;

Figure 1A:
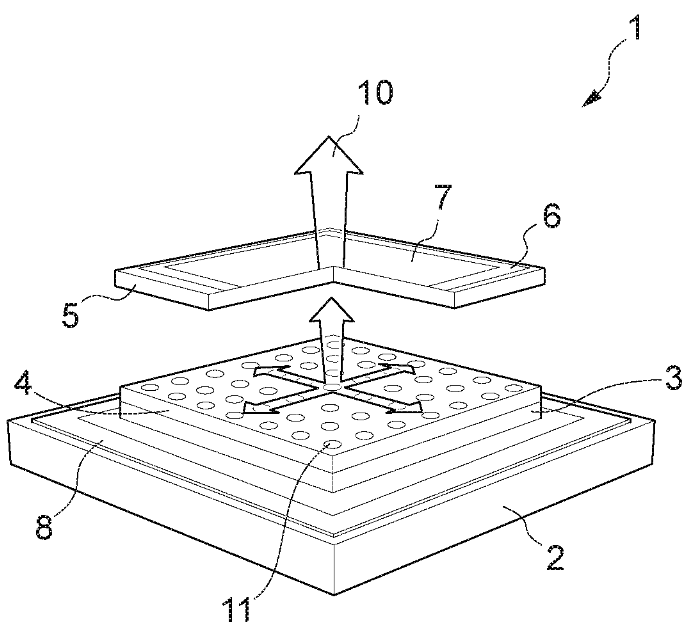
FIG. 1(*a*) presents an exploded perspective view of a photonic crystal surface emitting laser (PCSEL) as known in the art.

In the description which follows, like parts are marked throughout the specification and drawings with the same reference numerals. The drawings are not necessarily to scale and the proportions of certain parts have been exaggerated to better illustrate details and features of embodiments of the invention.

DETAILED DESCRIPTION

Details of electrical contacts suitable for use with a semiconductor device will now be described with reference to FIGS. 2 to 8.

Figure 2:
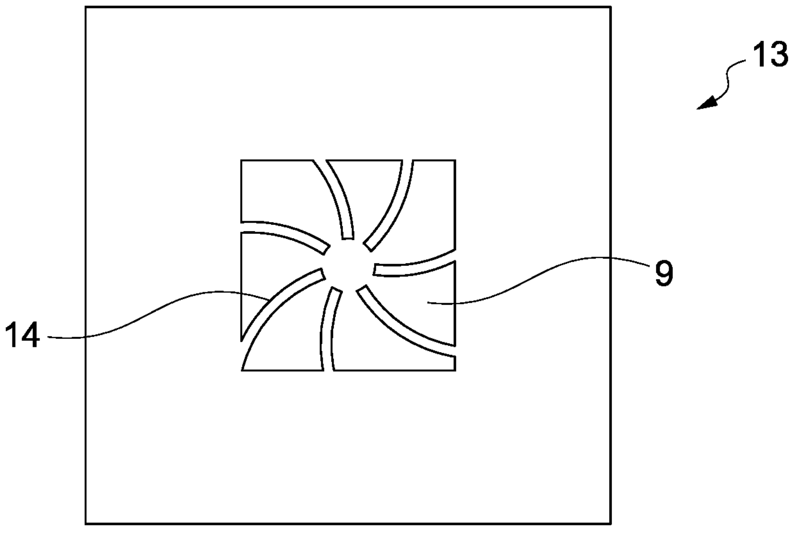
FIG. 2 presents a top view of an electrical contact in accordance with an embodiment of the present invention.

In particular, FIG. 2 presents a schematic representation of an electrical contact in accordance with a first embodiment of the present invention, as generally depicted by reference numeral 13. The electrical contact 13 can be seen to comprise a substantially square shaped perimeter area within which is located a square shaped aperture 9. In the presently described embodiment, the length of the sides of the square shaped aperture 9 are around 200 μm. Extending inwardly from the sides of the square shaped aperture 9 are six electrical tracks 14. In the presently described embodiment, the six electrical tracks 14 can be seen to form the arms of a spiral pattern, the centre of which coincides with the centre of the square shaped aperture 9. As will be appreciated by the skilled reader, there is no requirement for the ends of the six electrical tracks 14 to meet at the centre of the square shaped aperture 9, the six electrical tracks 14 instead extending from the squared shaped perimeter area to a free end within the square shaped aperture 9.

Figure 3:
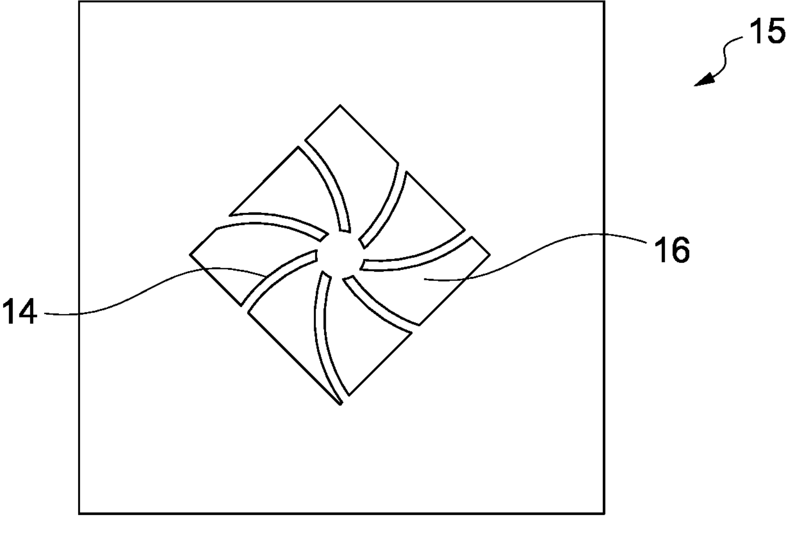
FIG. 3 presents a top view of an electrical contact in accordance with an alternative embodiment of the present invention.

An alternative embodiment of the electrical contact is presented in FIG. 3, as generally depicted by reference numeral 15. The electrical contact 15 can again be seen to comprise a substantially square shaped perimeter area however, in this embodiment there is located a diamond shaped aperture 16. In the presently described embodiment, the length of the sides of the diamond shaped aperture 16 are around 200 μm. Extending inwardly from sides of the diamond shaped aperture 16 are six electrical tracks 14 which can again be seen to form the arms of a spiral pattern, the centre of which coincides with the centre of the diamond shaped aperture 16. Again, the six electrical tracks 14 may extend from the squared shaped perimeter area to a free end within the diamond shaped aperture 16.

Figure 4:
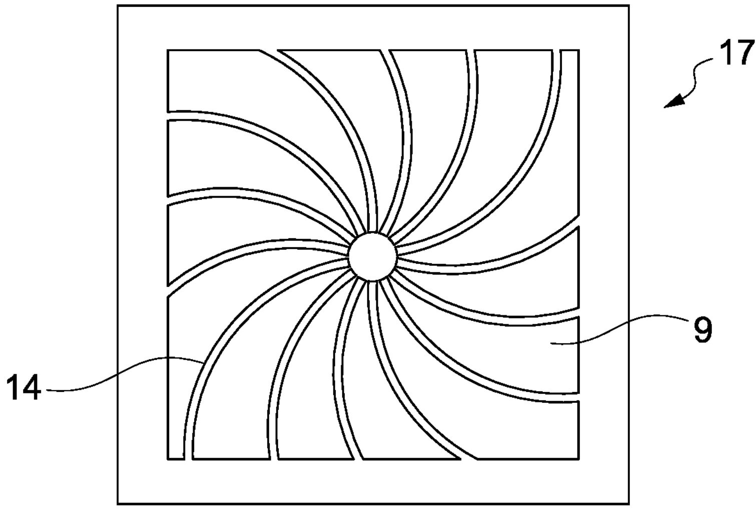
FIG. 4 presents a top view of an electrical contact in accordance with an alternative embodiment of the present invention.

Another alternative embodiment of the electrical contact is presented in FIG. 4, as generally depicted by reference numeral 17. This embodiment is similar to that discussed above with reference to FIG. 2. However, in this embodiment the length of the sides of the square shaped aperture 9 are around 400 μm and the spiral pattern contained therein comprises fourteen electrical tracks 14.

Figure 5:
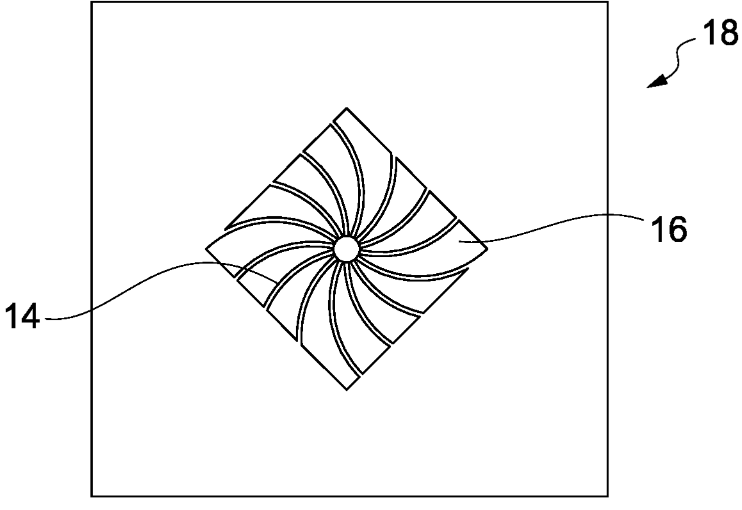
FIG. 5 presents a top view of an electrical contact in accordance with an alternative embodiment of the present invention.

A further alternative embodiment of the electrical contact is presented in FIG. 5, as generally depicted by reference numeral 18. This embodiment is similar to that discussed above with reference to FIG. 3. However, in this embodiment the length of the sides of the diamond shaped aperture 16 are around 400 μm while the spiral pattern contained therein comprises fourteen electrical tracks 14.

Figure 6:
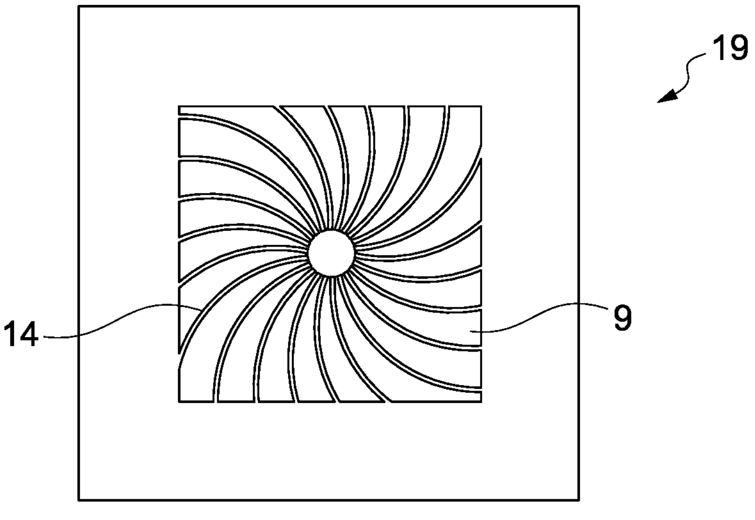
FIG. 6 presents a top view of an electrical contact in accordance with an alternative embodiment of the present invention.

A yet further alternative embodiment of the electrical contact is presented in FIG. 6, as generally depicted by reference numeral 19. This embodiment is similar to that discussed above with reference to FIG. 2. However, in this embodiment the length of the sides of the square shaped aperture 9 are around 600 μm while the spiral pattern contained therein comprises twenty-two electrical tracks 14.

Figure 7:
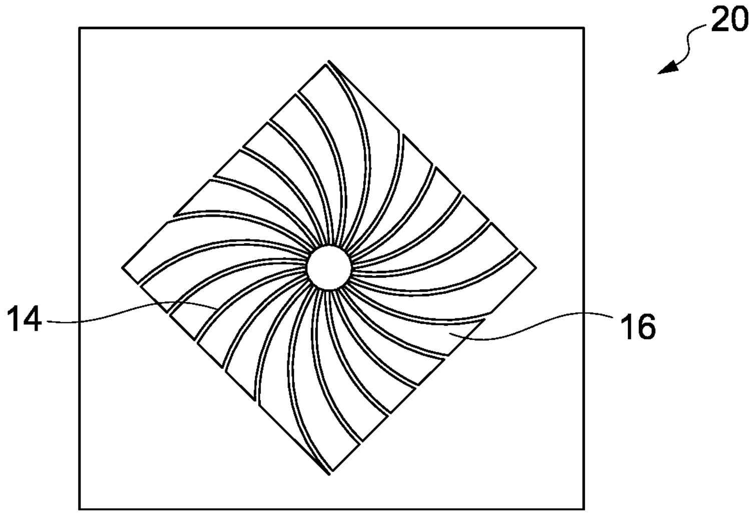
FIG. 7 presents a top view of an electrical contact in accordance with an alternative embodiment of the present invention.

A yet further alternative embodiment of the electrical contact is presented in FIG. 7, as generally depicted by reference numeral 20. This embodiment is similar to that discussed above with reference to FIG. 3. However, in this embodiment the length of the sides of the diamond shaped aperture 16 are around 600 μm while the spiral pattern contained therein comprises twenty-two electrical tracks 14.

Figure 8:
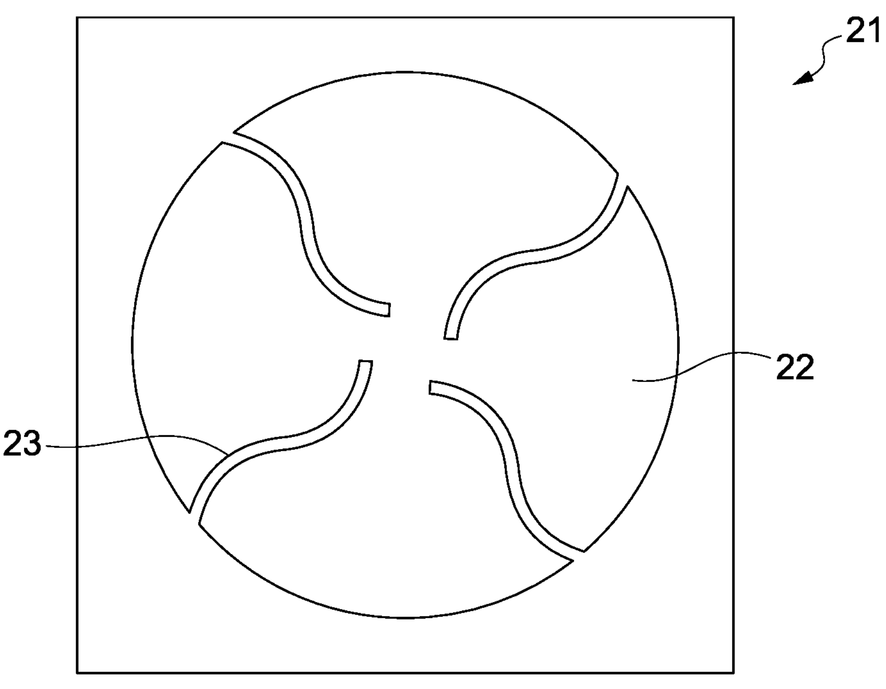
FIG. 8 presents a top view of an electrical contact in accordance with an alternative embodiment of the present invention.

An alternative embodiment of the electrical contact is presented in FIG. 8, as generally depicted by reference numeral 21. The electrical contact 21 can again be seen to comprise a substantially square shaped perimeter area however, in this embodiment there is located a circular aperture 22. Extending inwardly from sides of the circular shaped aperture 22 are four electrical tracks 23. In the presently described embodiment, the four electrical tracks 23 can be seen to be S-shaped. As will again be appreciated by the skilled reader, there is no requirement for the ends of the four electrical tracks 23 to meet at the centre of the circular shaped aperture 22, the four electrical tracks 23 instead extending from the squared shaped perimeter area to a free end within the circular shaped aperture 22.

Figure 1B:
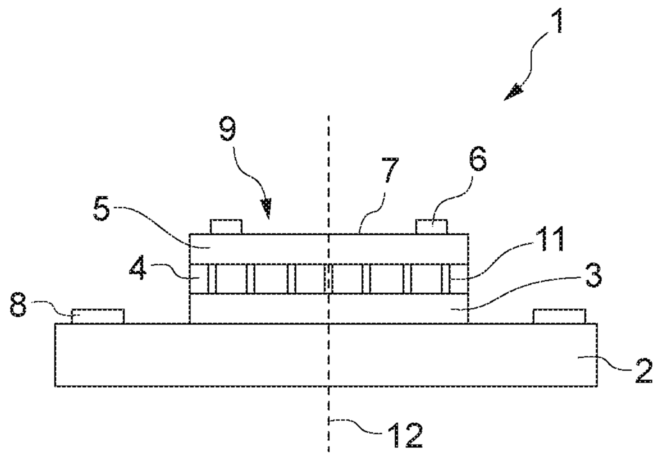

In order to highlight a number of advantages of the electrical contacts described above, FIG. 9 presents a perspective view of a photonic crystal surface emitting laser (PCSEL), as generally depicted by reference numeral 24, in accordance with an embodiment of the present invention. The PCSEL 24 can be seen incorporate a number of the features of the PCSEL 1 presented in FIGS. 1(*a*) and 1(*b*), and so like features are marked with like reference numerals. However, in the PCSEL 24 presented in FIG. 9 the first electrical contact 6 has been replaced with an electrical contact 13 of the type presented in FIG. 2.

It will be appreciated by the skilled reader that in alternative embodiments the electrical contacts 15, 17, 18, 19, 20 of any of FIGS. 3 to 8 could alternatively be employed within the PCSEL 24. It will also be appreciated by the skilled reader that the location of the first electrical contact 6 may be varied from the preferred location of the output surface 7 of the PCSEL 24. For example, the electrical contact 6 may be located on a cladding layer of a semiconductor laser device. Alternatively, the electrical contact may be located on the photonic crystal layer 4 or the active layer 3 of the semiconductor laser device.

The presence of the electrical tracks 14 provide a means for the electrical contact 13 to supplying a current across the square shaped aperture 9. The electrical tracks 14 thus act to remove, or significantly reduce, the problematic effects of current crowding within semiconductor devices in which they are employed e.g. the PCSEL 24 presented within FIG. 9.

Significantly, as each of the electrical tracks 14 are non-linear, the condition for a diffraction pattern to be imparted onto the emission profile of the output light 10 of the PCSEL 24 is removed. This makes the PCSEL 24 particularly suitable for employment within long range application e.g. laser power beaming, free space communication systems, 3-D printing and laser cutting.

Figure 9:
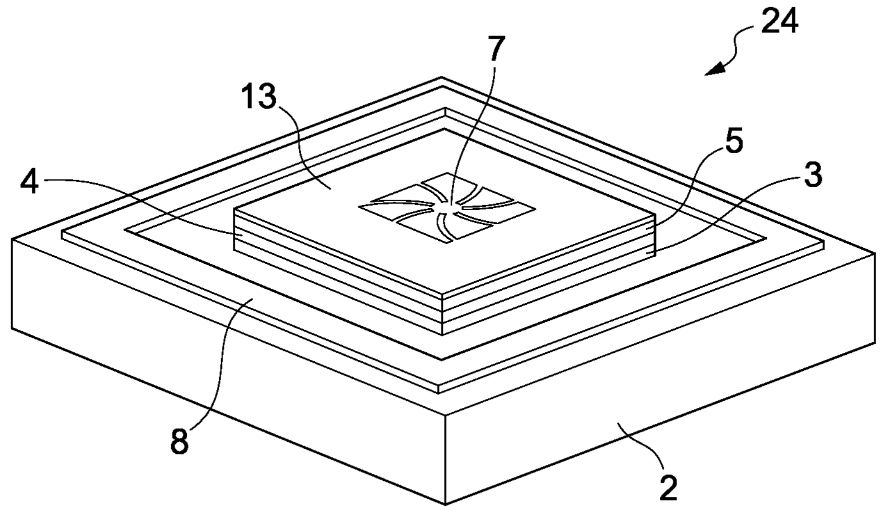
FIG. 9 presents a perspective view of a photonic crystal surface emitting laser (PCSEL) incorporating the electrical contact of FIG. 2.

Although FIG. 9 presents use of the electrical contact 13 with a PCSEL it will be appreciated by the skilled reader that the electrical contact 13 may equally well be employed with other semiconductor laser types e.g. edge emitting lasers (EEL). and Vertical Cavity Surface Emitting Lasers (VCSELs) or indeed any other semiconductor device that requires an electrical drive current.

It will be further appreciated by the skilled reader that the electrical contacts are not limited to the geometrical shapes described above with reference to FIGS. 2 to 8.

For example, the electrical contacts need not necessarily be square shaped and thus can take the form of any other regular or irregular geometric shape e.g. a rectangle or circle.

In a similar manner, the apertures located within the electrical contacts need not necessarily be square or diamond shaped but instead can take the form of any other regular or irregular geometric shape e.g. a rectangle or circle.

It will further be appreciated that the number, and shape, of the electrical tracks included within the electrical contacts may also vary. What is important is that the one or more electrical tracks are nonlinear in shape (or put another way, do not comprise, in whole or in part a linear shape) thus ensuring that the condition for a diffraction pattern to be imparted onto the emission profile of the output light of any associated laser structure is removed, or at least significantly reduced. Alternative, electrical track shaped may include s-shaped or otherwise curved shaped tracks. Furthermore, the electrical tracks may not follow a regular pattern such as the spiral or s-shaped designs illustrated herein and need not necessarily extend towards a common point.

The electrical contacts may be formed from any material known in the art including electrically conductive metals that are typically deposited via sputter deposition, evaporation or chemical vapor deposition (CVD). However, the applicant's preferred material employed to produce the electrical contacts is gold (Au).

An electrical contact for a semiconductor device, and a method of forming an electrical contact is disclosed. The electrical contact comprises a perimeter area, an aperture located within the perimeter area and one or more electrical tracks extending from the perimeter area into the aperture. The one or more electrical tracks comprise a non-linear shape. The presence of the one or more electrical tracks within the aperture provides a means to remove, or significantly reduce, the problematic effects of current crowding within a semiconductor device in which it is employed. The electrical contacts provide particular application for semiconductor laser devices. When the electrical contact is located on an output surface of the semiconductor laser device, the condition for a diffraction pattern to be imparted onto the emission profile of the output light of the semiconductor laser device is removed, thus improving the overall beam quality of the output light.

Throughout the specification, unless the context demands otherwise, the term "comprise" or "include", or variations such as "comprises" or "comprising", "includes" or "including" will be understood to imply the inclusion of a stated integer or group of integers, but not the exclusion of any other integer or group of integers.

Furthermore, reference to any prior art in the description should not be taken as an indication that the prior art forms part of the common general knowledge.

The foregoing description of the invention has been presented for purposes of illustration and description and is not intended to be exhaustive or to limit the invention to the precise form disclosed. The described embodiments were chosen and described in order to best explain the principles of the invention and its practical application to thereby enable others skilled in the art to best utilise the invention in various embodiments and with various modifications as are suited to the particular use contemplated. Therefore, further modifications or improvements may be incorporated without departing from the scope of the invention as defined by the appended claims.

The invention claimed is:

1. An electrical contact for a semiconductor device, the electrical contact comprising a perimeter area, an aperture located within the perimeter area and two or more electrical tracks, each extending from the perimeter area to a free end within the aperture, wherein the two or more electrical tracks comprise a non-linear shape and form the arms of a spiral pattern.

2. An electrical contact as claimed in claim 1 wherein a centre of the spiral pattern coincides with the centre of the aperture.

3. An electrical contact as claimed in claim 1 wherein the electrical contact comprises a regular shape.

4. An electrical contact as claimed in claim 1 wherein the aperture comprises a regular shape.

5. An electrical contact as claimed in claim 1 wherein the electrical contact is formed from an electrically conductive metal.

6. An electrical contact as claimed in claim 5 wherein the electrical contact is formed from gold (Au).

7. A semiconductor laser device comprising an electrical contact as claimed in claim 1.

8. A semiconductor laser device as claimed in claim 7 wherein the electrical contact is located on an output surface of the semiconductor laser device.

9. A semiconductor laser device as claimed in claim 7 wherein the electrical contact is located on a cladding layer of the semiconductor laser device.

10. A semiconductor laser device as claimed in claim 7 wherein the electrical contact is located on a photonic crystal layer or an active layer of the semiconductor laser device.

11. A semiconductor laser device as claimed in claim 7 wherein the semiconductor laser device comprises a photonic crystal surface emitting laser (PCSEL).

12. A semiconductor laser device as claimed in claim 7 wherein the semiconductor laser device comprises a vertical cavity surface emitting laser (VCSEL).

13. A method of forming an electrical contact for a semiconductor device, the method comprising:

defining a perimeter area of the electrical contact;

providing an aperture located within the perimeter area; and providing two or more electrical tracks, each extending from the perimeter area to a free end within the aperture wherein the two or more electrical tracks comprise a non-linear shape and form the arms of a spiral pattern.

14. A method of forming a semiconductor laser device, the method comprising providing an electrical contact formed by the method of claim 13 within the semiconductor laser device.

15. A method of forming a semiconductor laser device as claimed in claim 14 wherein the electrical contact is formed on an output surface of the semiconductor laser device.

16. A method of forming a semiconductor laser device as claimed in claim 14 wherein the semiconductor laser device comprises a photonic crystal surface emitting laser (PCSEL).

17. A method of forming a semiconductor laser device as claimed in claim 14 wherein the semiconductor laser device comprises a vertical cavity surface emitting laser (VCSEL).

18. An electrical contact for a semiconductor device, the electrical contact comprising a perimeter area, an aperture located within the perimeter area and a plurality of electrical tracks, each of the plurality of electrical tracks extending from the perimeter area to a free end within the aperture, wherein each of the plurality of electrical tracks comprises non-linear shape and wherein the plurality of electrical tracks form the arms of a spiral pattern.

19. The electrical contact as claimed in claim 18, wherein a centre of the spiral pattern coincides with the centre of the aperture.

20. The electrical contact as claimed in claim 18, wherein all of the plurality of electrical tracks are electrically connected to each other via the perimeter area of the electrical contact.

* * * * *